United States Patent
Kim et al.

(10) Patent No.: US 9,336,847 B2
(45) Date of Patent: May 10, 2016

(54) METHOD AND APPARATUS FOR GENERATING A REFERENCE FOR USE WITH A MAGNETIC TUNNEL JUNCTION

(71) Applicant: QUALCOMM Incorporated, San Diego, CA (US)

(72) Inventors: Sungryul Kim, San Diego, CA (US); Taehyun Kim, San Diego, CA (US); Jung Pill Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 87 days.

(21) Appl. No.: 14/257,794

(22) Filed: Apr. 21, 2014

(65) Prior Publication Data

US 2015/0302912 A1    Oct. 22, 2015

(51) Int. Cl.
*G11C 7/14*      (2006.01)
*G11C 11/16*     (2006.01)

(52) U.S. Cl.
CPC .............. *G11C 11/1673* (2013.01); *G11C 7/14* (2013.01)

(58) Field of Classification Search
CPC ................... G11C 11/1673; G11C 7/14
See application file for complete search history.

(56) References Cited

U.S. PATENT DOCUMENTS

| | | | |
|---|---|---|---|
| 6,697,294 B1 * | 2/2004 | Qi | G11C 11/16 365/158 |
| 7,239,537 B2 | 7/2007 | DeBrosse et al. | |
| 7,532,533 B2 * | 5/2009 | Andre | G11C 17/18 365/158 |
| 8,194,439 B2 * | 6/2012 | Kim | G11C 11/16 365/158 |
| 8,320,166 B2 | 11/2012 | Park et al. | |
| 2005/0180205 A1 * | 8/2005 | Park | G11C 7/062 365/171 |
| 2011/0110140 A1 * | 5/2011 | Chang | G11C 5/147 365/148 |
| 2013/0121066 A1 * | 5/2013 | Zhu | G11C 11/16 365/158 |
| 2013/0265820 A1 * | 10/2013 | Chih | G11C 11/1673 365/158 |
| 2013/0293286 A1 | 11/2013 | Li et al. | |

OTHER PUBLICATIONS

International Search Report and Written Opinion—PCT/US2015/018288—ISA/EPO—Jun. 2, 2015.

* cited by examiner

*Primary Examiner* — Khamdan Alrobaie
(74) *Attorney, Agent, or Firm* — Muncy, Geissler, Olds & Lowe, P.C.

(57) ABSTRACT

Methods and apparatus for generating a reference for use with a magnetic tunnel junction are provided. In an example, provided is a magnetoresistive read only memory including a magnetic tunnel junction (MTJ) storage element, a sense amplifier having a first input coupled to the MTJ storage element, and a reference resistance device coupled to a second input of the sense amplifier. The reference resistance device includes a plurality of groups of at least two reference MTJ devices. Each reference MTJ device in a respective group is coupled in parallel with each other reference MTJ device in the respective group. Each group is coupled in series with the other groups. This arrangement advantageously mitigates read disturbances and reference level variations, while saving power, reducing reference resistance device area, and increasing read speed.

20 Claims, 16 Drawing Sheets

PARALLEL MAGNETIZATION
LOW RESISTANCE
STATE "0"

ANTIPARALLEL MAGNETIZATION
HIGH RESISTANCE
STATE "1"

US 9,336,847 B2

METHOD AND APPARATUS FOR GENERATING A REFERENCE FOR USE WITH A MAGNETIC TUNNEL JUNCTION

FIELD OF DISCLOSURE

This disclosure relates generally to electronics, and more specifically, but not exclusively, to methods and apparatus that generate a reference for use with a magnetic tunnel junction.

BACKGROUND

Random access memory (RAM) is a ubiquitous component of modern digital circuit architectures. RAM can be a standalone device, or can be integrated in a device that uses the RAM, such as a microprocessor, microcontroller, application specific integrated circuit (ASIC), system-on-chip (SoC), and other like devices. RAM can be volatile or non-volatile. Volatile RAM loses its stored information whenever power is removed. Non-volatile RAM can maintain its memory contents even when power is removed. Although non-volatile RAM has advantages, such as an ability to retain its contents without applied power, conventional non-volatile RAM has slower read/write times than volatile RAM.

Magnetoresistive Random Access Memory (MRAM) is a non-volatile memory technology having response (read/write) times comparable to volatile memory. Data stored in MRAM does not degrade over time and, compared to other RAM technologies, MRAM uses very little power. In contrast to conventional RAM technologies, which store data as electric charges or current flows, MRAM uses magnetic storage elements. As illustrated in FIGS. 1A and 1B, a magnetic tunnel junction (MTJ) storage element 100 can be formed from two magnetic layers—a fixed layer 110 and a free layer 130, each of which can retain a magnetic field and are separated by an insulating layer 120 (e.g., a tunnel barrier layer). One of the two layers (e.g., the fixed layer 110), is pinned to a particular polarity. The polarity of the other layer 140 (e.g., the free layer 130) is free to change to match that of an externally-applied magnetic field. When the polarities of the fixed layer 110 and the free layer 130 are not aligned (i.e., antiparallel), the MTJ storage element 100 has a higher electrical resistance than when the polarities of the fixed and free layers are aligned (i.e., parallel). Thus, a change in the polarity 140 of the free layer 130 changes the resistance of the MTJ storage element 100. For example, when the polarities are aligned, as depicted in FIG. 1A, the MTJ storage element 100 has a relatively low electrical resistance. When the polarities are not aligned, as depicted in FIG. 1B, then the MTJ storage element 100 has a relatively high electrical resistance. Therefore, the MTJ storage element 100 can represent logic "0" in one of these magnetic states and to represent logic "1" in the other state, thus allowing the MTJ storage element 100 to be used as a magnetic memory element in an MRAM. The depiction of MTJ storage element 100 in FIGS. 1A and 1B is simplified, and each depicted layer can comprise one or more layers of materials.

Referring to FIG. 2A, a conventional memory cell 200 of a conventional field switching MRAM is depicted during a read operation. The memory cell 200 includes a transistor 210, a bit line 220, a digit line 230, and a word line 240. The memory cell 200 is read by measuring the electrical resistance of the MTJ storage element 100. For example, the MTJ storage element 100 in the memory cell 200 can be selected from a group of MTJ storage elements by activating an associated transistor 210 to switch current from a bit line 220 through the MTJ storage element 100. Due to a tunnel magnetoresistive effect, the electrical resistance of the MTJ 100 is based on the relative orientation of the polarities of the two magnetic layers (e.g., the fixed layer 110, the free layer 130). For example, if the fixed layer 110 and the free layer 130 have the same polarity, the resistance is low and a first logic state (e.g., a logic "0") is read. If the fixed layer 110 and the free layer 130 have opposing polarities, the resistance is higher and a second logic state (e.g., a logic "1") is read. When a current is passed through the MTJ storage element 100, a voltage drop is created across the MTJ storage element 100 due to the electrical resistance of the MTJ storage element 100. The voltage drop across the MTJ storage element 100 is compared to a reference voltage (e.g., a reference bit line) to determine if the resistance of the MTJ storage element 100 is relatively high or low, thus determining if the MTJ storage element 100 is in the first logic state or the second logic state.

Referring to FIG. 2B, the memory cell 200 of a conventional field switching MRAM is depicted during a write operation, which is a magnetic operation. Transistor 210 is off during the write operation. Current flows through the bit line 220 and the digit line 230 to establish magnetic fields 250 and 260, which affect the polarity of the free layer 130 of the MTJ storage element 100, and consequently the logic state of the memory cell 200. Accordingly, data is written to, and stored in, the MTJ storage element 100 and thus the memory cell 200.

MRAM has several desirable characteristics that make it a candidate for a universal memory, such as high speed, high density (i.e., small bitcell size), low power consumption, and no logic state degradation over time. Accordingly, a non-volatile MRAM memory can be fabricated from an array of the memory cells 200.

Despite the characteristics described above, conventional MRAM devices are not perfect. Due in part to fabrication variations, resistances of MTJs in a reference bit line can vary from MTJ to MTJ. This leads to reference voltage variations, poor sensing margin, and read disturbances.

Conventional attempts to resolve these problems include a conventional merged reference generator device 300, as depicted in FIGS. 3A-3C. FIG. 4 also depicts a conventional approach using a conventional reference bitline 400. These approaches can suffer from excessive complexity, can require additional integrated circuit layers, and can ineffectively mitigate the read disturbances they are intended to resolve.

Accordingly, there are long-felt industry needs for methods and apparatus that improve upon conventional methods and apparatus, including the improved methods and apparatus provided hereby.

SUMMARY

This summary provides a basic understanding of some aspects of the present teachings. This summary is not exhaustive in detail, and is neither intended to identify all critical features, nor intended to limit the scope of the claims.

Exemplary methods and apparatus for reading a magnetic tunnel junction (MTJ) storage element are provided. An exemplary method includes passing a first current through the MTJ storage element to generate a first voltage and passing a second current through a reference resistance device to generate a second voltage. The reference resistance device includes a plurality of groups of at least two reference MTJ devices. Each reference MTJ device in a respective group is coupled in parallel with each other reference MTJ device in the respective group, and each group of reference MTJ devices is coupled in series with the other groups of reference MTJ devices. The method also includes comparing the first voltage to the second voltage using a sense amplifier, and outputting a high or low signal from the sense amplifier, dependent upon the comparison results. In examples, each group of reference MTJ devices includes sixteen reference MTJ devices. The method can also include at least one of selectively enabling and selectively disabling at least one of the reference MTJ devices. A row decoder can be used to perform the at least one of selectively enabling and selectively disabling at least one of the reference MTJ devices. Also, the method can include shorting across at least one of the reference MTJ devices.

In a further example, provided is a non-transitory computer-readable medium, comprising instructions stored thereon that, if executed by a processor, such as a special-purpose processor, cause the processor to execute at least a part of the aforementioned method. The non-transitory computer-readable medium can be integrated with a device, such as a mobile device, a music player, a video player, an entertainment unit, a navigation device, a communications device, a personal digital assistant (PDA), a fixed location data unit, and/or a computer.

In another example, provided is an apparatus configured to read a magnetic tunnel junction (MTJ) storage element. The apparatus includes means for passing a first current through the MTJ storage element to generate a first voltage, as well as means for passing a second current through a reference resistance device to generate a second voltage. The reference resistance device can include a plurality of groups of at least two reference MTJ devices. Each reference MTJ device in a respective group is coupled in parallel with each other reference MTJ device in the respective group, and each group of reference MTJ devices is coupled in series with the other groups of reference MTJ devices. The apparatus also includes a sense amplifier configured to compare the first voltage to the second voltage and output a high or low signal, dependent upon the comparison results. Each group of reference MTJ devices can include sixteen reference MTJ devices. The apparatus can include at least one of means for selectively enabling and means for selectively disabling at least one of the reference MTJ devices. The apparatus can also include a row decoder configured to at least one of selectively enable and selectively disable at least one of the reference MTJ devices. In an example, the apparatus includes means for shorting across at least one of the reference MTJ devices.

At least a part of the apparatus can be integrated in a semiconductor die. Further, at least a part of the apparatus can be a part of a device, such as a mobile device, a set top box, a music player, a video player, an entertainment unit, a navigation device, a communications device, a personal digital assistant (PDA), a fixed location data unit, and/or a computer, with another part of the apparatus being a constituent part of the device. In a further example, provided is a non-transitory computer-readable medium, comprising lithographic device—executable instructions stored thereon configured to cause a lithographic device to fabricate at least a part of the apparatus.

In another example, provided is an apparatus configured to read a magnetic tunnel junction (MTJ) storage element. The apparatus includes a magnetoresistive read only memory that includes a magnetic tunnel junction storage element, a sense amplifier having a first input coupled to the magnetic tunnel junction (MTJ) storage element, and a reference resistance device coupled to a second input of the sense amplifier. The reference resistance device includes a plurality of groups of at least two reference MTJ devices, where each reference MTJ device in a respective group is coupled in parallel with each other reference MTJ device in the respective group, and each group is coupled in series with the other groups. In an example, each group of reference MTJ devices includes sixteen reference MTJ devices. At least one of the reference MTJ devices can be coupled in series with a transistor configured to enable and disable the respective reference MTJ device. The apparatus can also include a row decoder configured to enable and disable at least one of the reference MTJ devices. The apparatus can include a transistor configured to short across at least one of the reference MTJ devices.

At least a part of the apparatus can be integrated on a semiconductor die. Further, at least a part of the apparatus can include a device, such as a mobile device, a base station, a set top box, a music player, a video player, an entertainment unit, a navigation device, a communications device, a personal digital assistant (PDA), a fixed location data unit, and/or a computer, with another part of the apparatus being a constituent part of the device. In a further example, provided is a non-transitory computer-readable medium, comprising lithographic device—executable instructions stored thereon configured to cause a lithographic device to fabricate at least a part of the apparatus.

The foregoing broadly outlines some of the features and technical advantages of the present teachings in order that the detailed description and drawings can be better understood. Additional features and advantages are also described in the detailed description. The conception and disclosed embodiments can be readily utilized as a basis for modifying or designing other structures for carrying out the same purposes of the present teachings. Such equivalent constructions do not depart from the technology of the teachings as set forth in the claims. The inventive features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

Figure 1A:
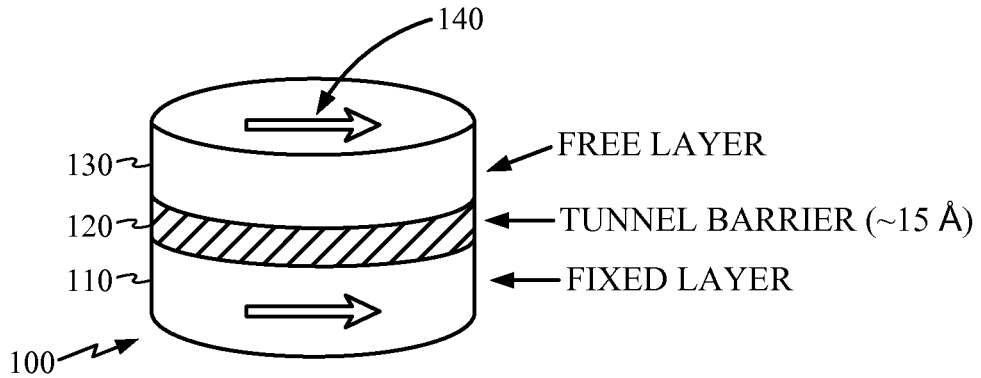
FIGS. 1A-1B depict a magnetic tunnel junction (MTJ) storage element.
Figure 1B:
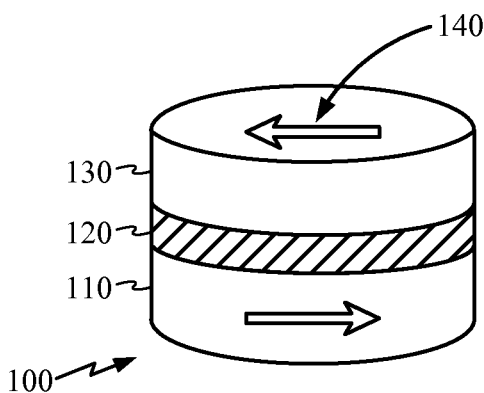
Figure 2A:
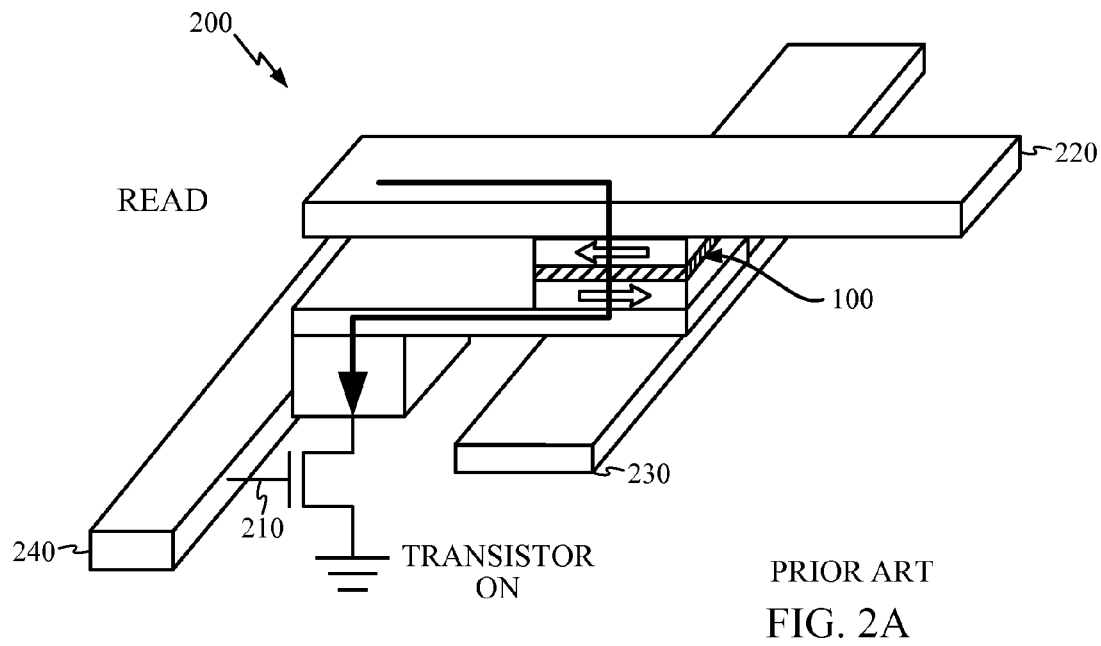
FIGS. 2A-2B depict a Magnetoresistive Random Access Memory (MRAM) cell during read and write operations.
Figure 2B:
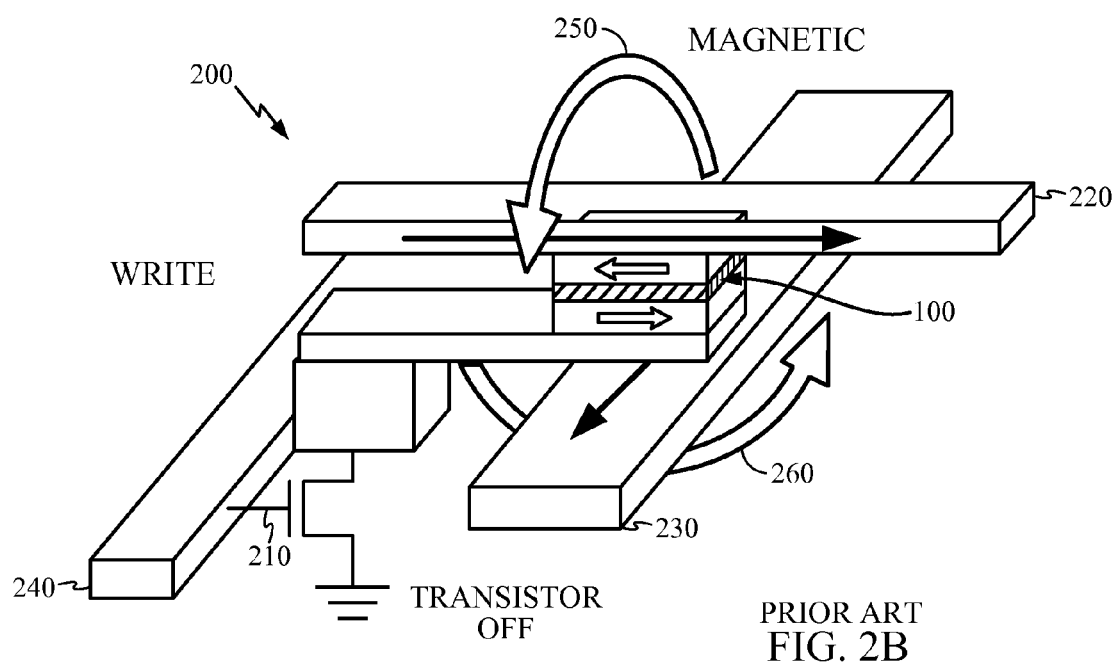
Figure 3A:
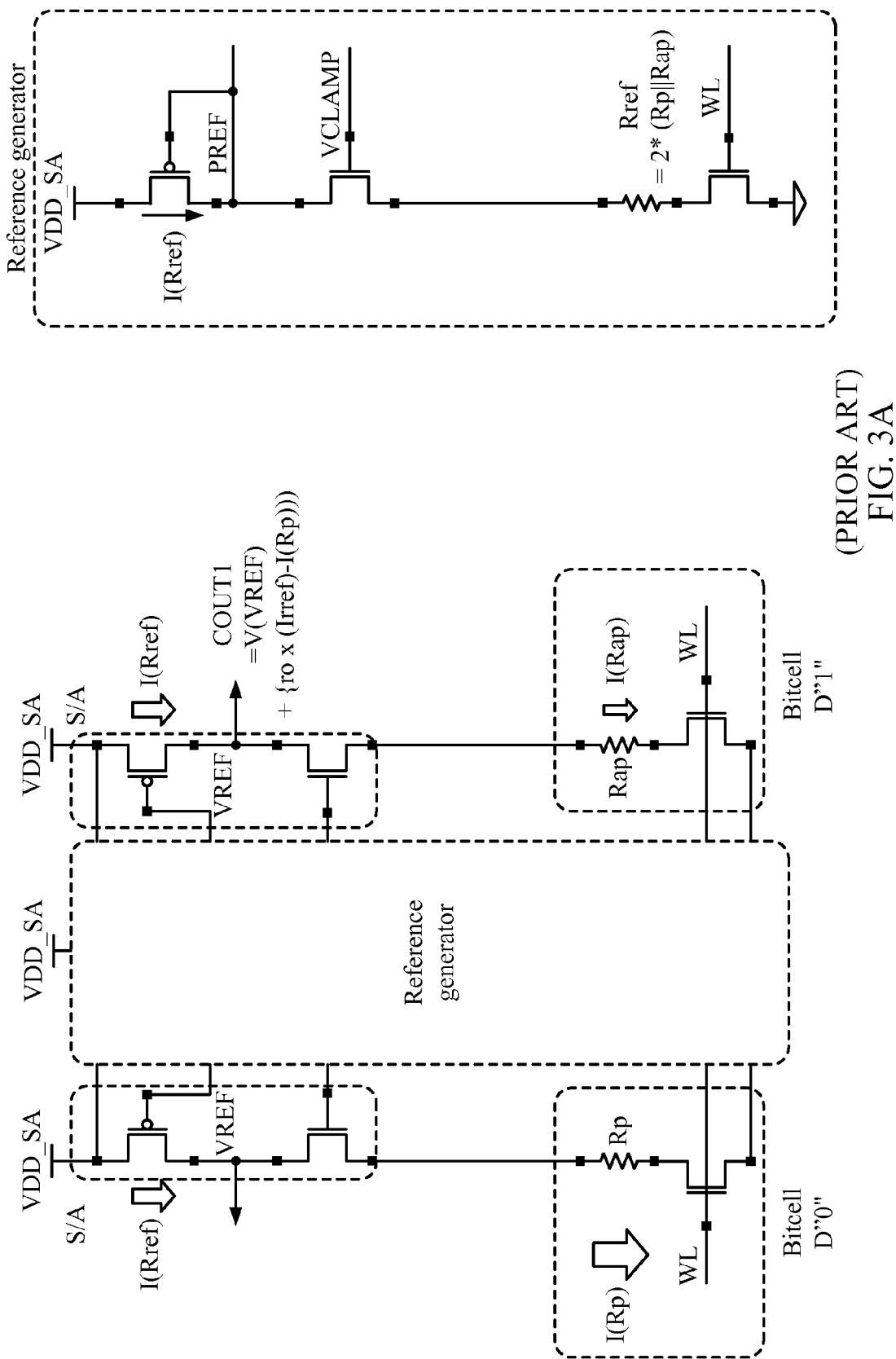
FIGS. 3A-3C depict a conventional merged reference generator device.
Figure 3B:
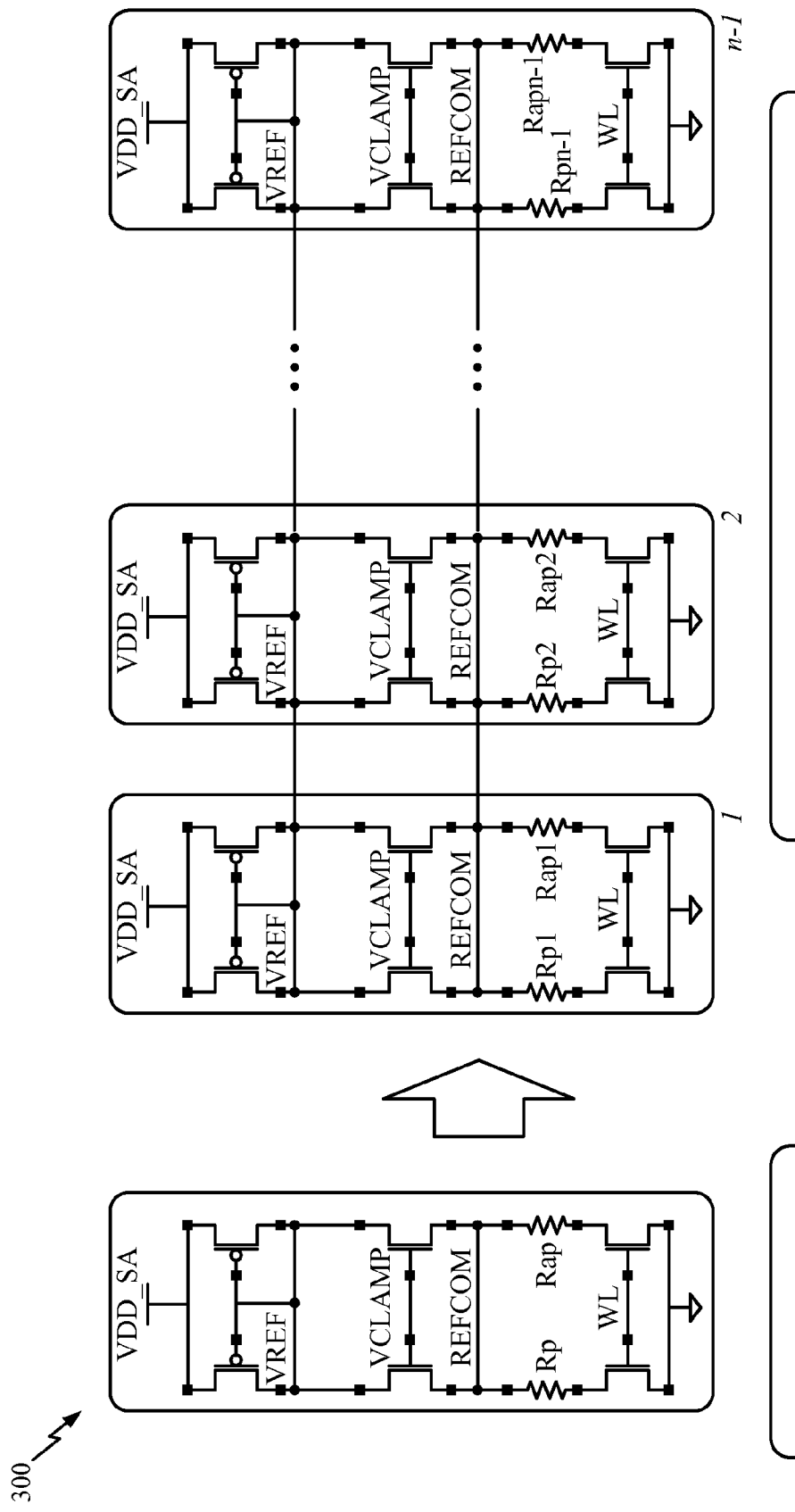
Figure 3C:
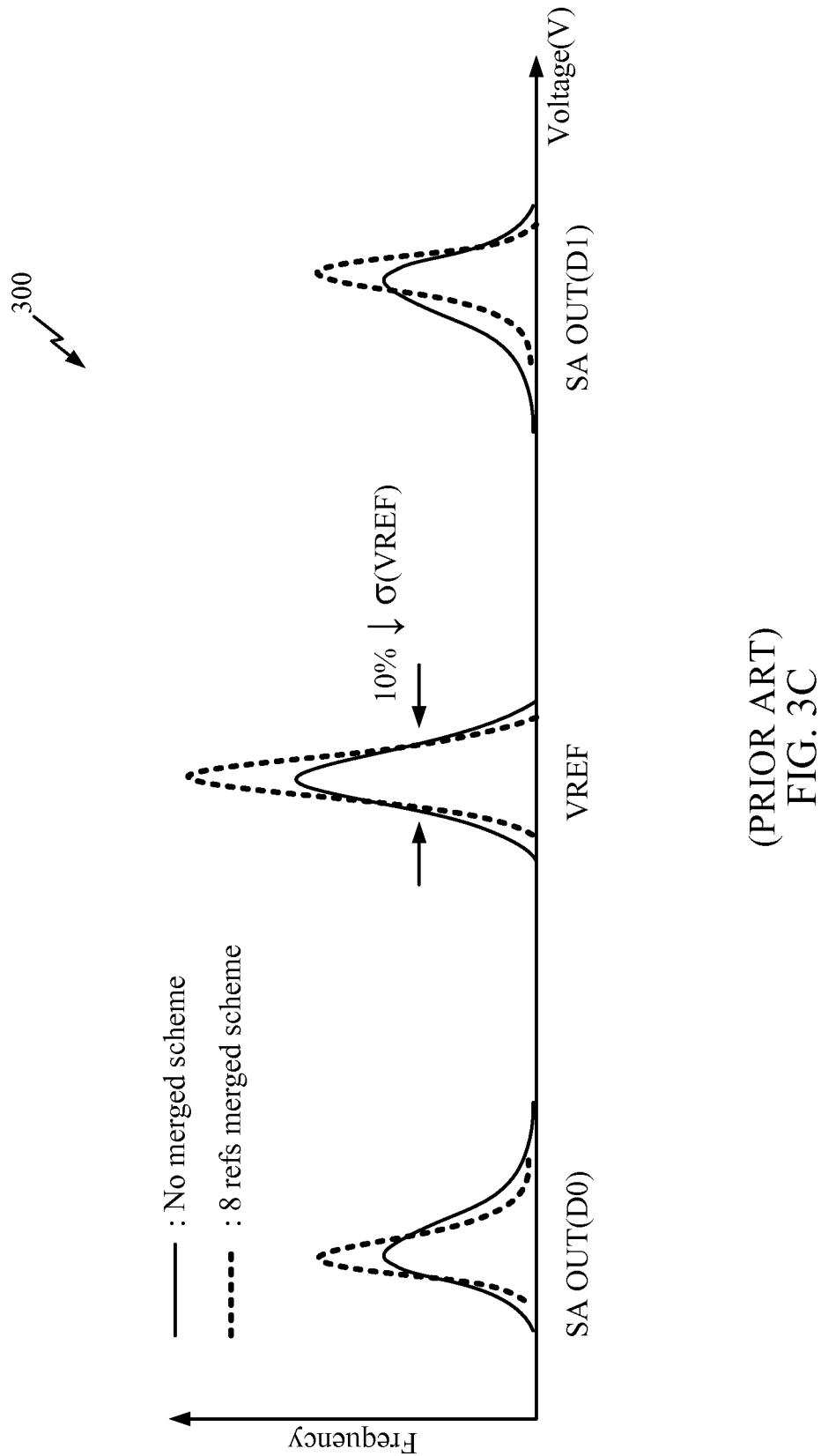
Figure 4:
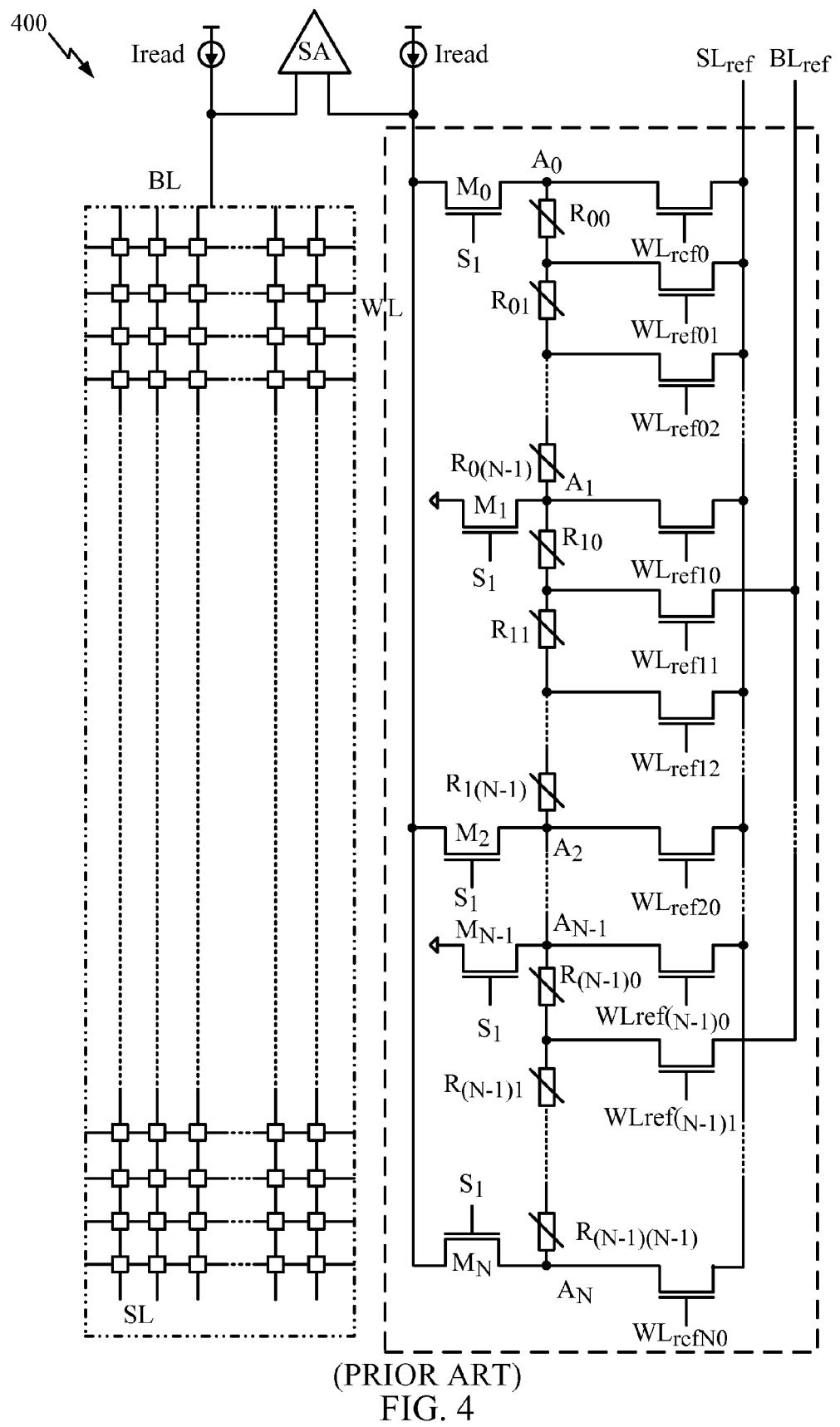
FIG. 4 depicts a conventional approach using a conventional reference bitline.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Introduction

Methods and apparatus that generate a reference for use with a magnetic tunnel junction are provided. In an example, provided is a magnetoresistive read only memory (MRAM) including a magnetic tunnel junction (MTJ) storage element, a sense amplifier having a first input coupled to the MTJ storage element, and a reference resistance device coupled to a second input of the sense amplifier. The reference resistance device includes a plurality of groups of reference MTJ devices. Each reference MTJ device in a respective group is coupled in parallel with each other reference MTJ device in the respective group. Each group is coupled in series with the other groups.

The exemplary apparatuses and methods disclosed herein advantageously address the long-felt industry needs, as well as other previously unidentified needs, and mitigate shortcomings of the conventional methods and apparatus. For example, advantages provided by the disclosed apparatuses and methods herein include mitigating read disturbances and reference level variations, while saving power, reducing reference resistance device area, and increasing read speed.

Exemplary embodiments are disclosed in this application's text and drawings. Alternate embodiments can be devised without departing from the scope of the invention. Additionally, conventional elements of the current teachings may not be described in detail, or may be omitted, to avoid obscuring aspects of the current teachings.

As used herein, the term "exemplary" means "serving as an example, instance, or illustration." Any embodiment described as "exemplary" is not necessarily to be construed as preferred or advantageous over other embodiments. Likewise, the term "embodiments of the invention" does not require that all embodiments of the invention include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

The terminology used herein is for the purpose of describing particular embodiments only and is not intended to be limiting. As used herein, the singular forms "a," "an," and "the" are intended to include the plural forms as well, unless the context clearly indicates otherwise. Further, the terms "comprises," "comprising," "includes," and "including," when used herein, specify a presence of stated features, integers, steps, operations, elements, and/or components, but do not preclude the presence and/or addition of one or more other features, integers, steps, operations, elements, components, and/or groups thereof.

The provided apparatuses can be a part of and/or coupled to, an electronic device having a memory, such as, but not limited to, a mobile device, a mobile telephone, a wireless device, a personal data assistant (PDA), a hand-held computer, a portable computer, a GPS receiver, a navigation device, a camera, an audio player, a camcorder, a game console, a watch, a clock, a calculator, a television, a flat panel display, a computer monitor, an auto display (e.g., an odometer display, etc.), a cockpit control and/or display, a display coupled to a camera (e.g., a rear and/or side view camera in a vehicle), an electronic photograph frame, an electronic billboard, an electronic sign, and/or a projector.

The provided apparatuses can be a part of and/or coupled to a "mobile device," such as, and not limited to, a mobile phone, a mobile communication device, a pager, a personal digital assistant, a personal information manager, a mobile handheld computer, a portable computer, a wireless device, a wireless modem, an electronic device having a memory, and/or other types of portable electronic devices typically carried by a person and having communication capabilities (e.g., wireless, cellular, infrared, short-range radio, etc.). Further, the terms "user equipment" (UE), "mobile terminal," "mobile device," and "wireless device" can be interchangeable.

DESCRIPTION OF THE FIGURES

Figure 5:
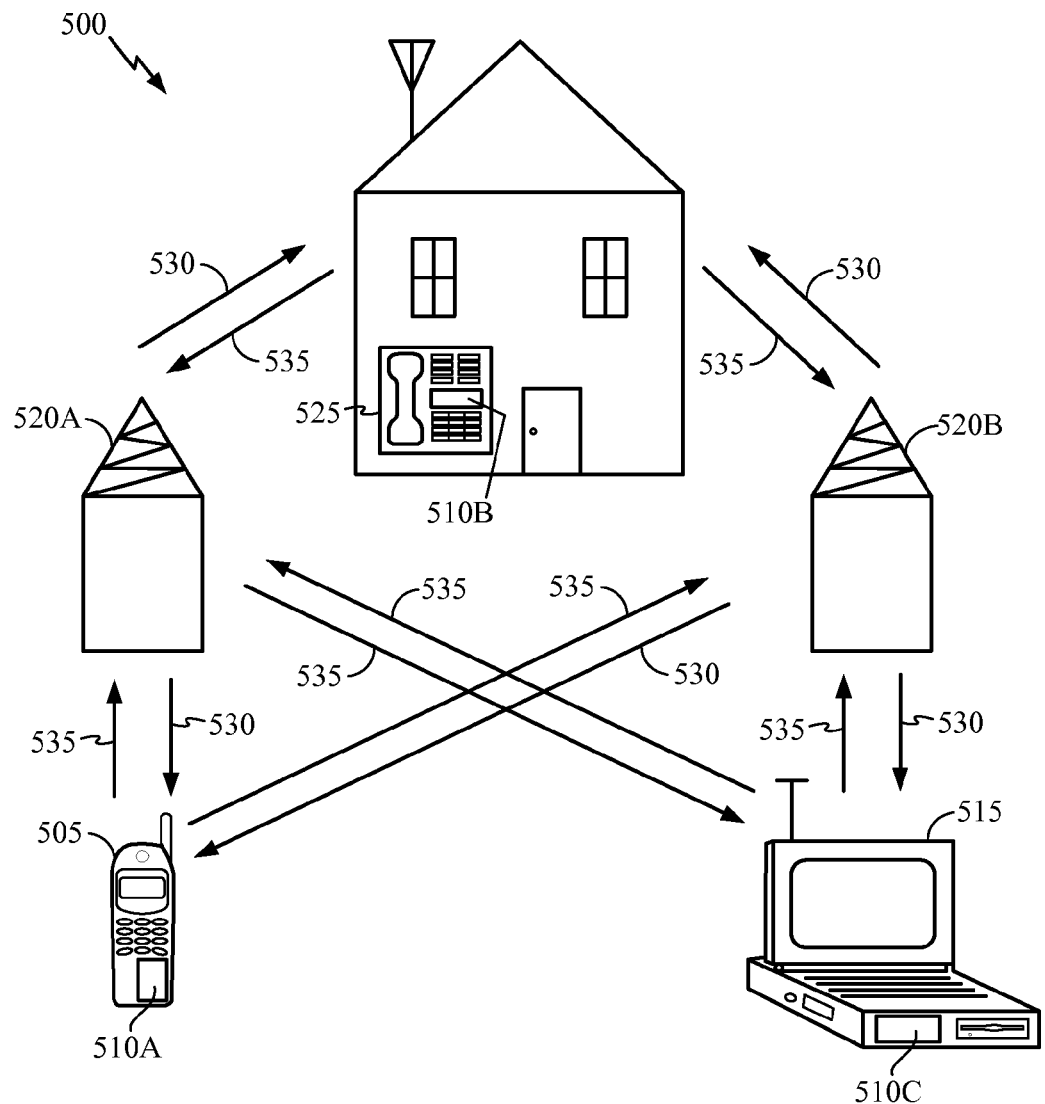
FIG. 5 depicts an exemplary communication system.

FIG. 5 depicts an exemplary communication system 500 in which an embodiment of the disclosure can be advantageously employed. For purposes of illustration, FIG. 5 shows three remote units 505, 515, and 525 and two base stations 520A-B. The wireless communication system 500 can have more or fewer remote units and more or fewer base stations. The remote units 505, 515, and 525 include at least a part of an embodiment 510A-C of the disclosure as discussed further herein. FIG. 5 also shows forward link signals 530 from the base stations 520A-B and the remote units 505, 515, and 525, as well as reverse link signals 535 from the remote units 505, 515, and 525 to the base stations 520A-B.

In FIG. 5, the remote unit 505 is shown as a mobile telephone, the remote unit 515 is shown as a portable computer, and the remote unit 525 is shown as a fixed location remote unit in a wireless local loop system. In examples, the remote units 515 can be a mobile device, a mobile phone, a hand-held personal communication systems (PCS) unit, a portable data unit such as a personal data assistant, a GPS-enabled device, a navigation device, a set top box, a music player, a mobile device, a video player, an entertainment unit, or any other device that stores or retrieves data or computer instructions, or any combination thereof. Although FIG. 5 depicts remote units according to the teachings of the disclosure, the disclosure is not limited to these exemplary remote units. Embodiments of the disclosure can be suitably employed in any device which includes MRAM memory.

Figure 6:
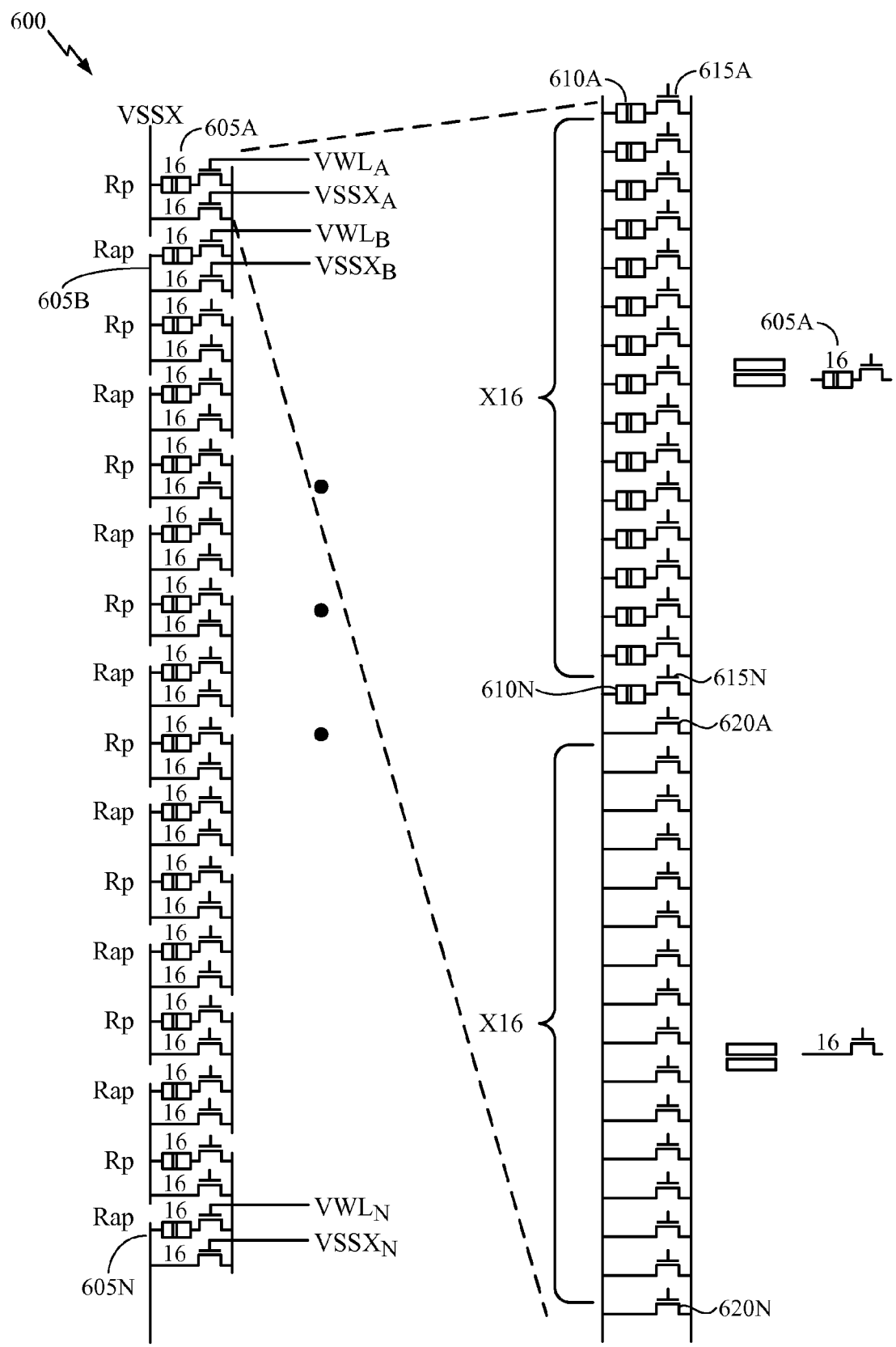
FIG. 6 depicts an exemplary reference resistance device.

FIG. 6 depicts an exemplary reference resistance device 600, which is also known as a reference bit line (BL). The reference resistance device 600 includes a plurality of groups 605A-N of reference MTJ devices 610A-N. Each reference MTJ device (e.g., reference MTJ device 610A) in a respective group (e.g., group 605A) is coupled in parallel with each other reference MTJ device (e.g., reference MTJ devices 610B-N) in the respective group (e.g., group 605A), and each group (e.g., group 605A) is coupled in series with the other groups (e.g., groups 605B-N). Each group (e.g., group 605A) can include at least two reference MTJ devices (e.g., reference MTJ devices 610A-B) coupled in parallel with each other (e.g., reference MTJ device 610A is coupled in parallel with reference MTJ device 610B).

At least one of the reference MTJ devices 610A-N can be coupled in series with a respective switching transistor 615A-N that is configured to enable and disable the MTJ devices 610A-N. A respective reference write line ($VWL_{A-N}$) can be coupled to control the switching transistor 615A-N. The reference write line ($VWL_{A-N}$) can be controlled by a row decoder.

In a further example, at least one of the reference MTJ devices 610A-N can be coupled in parallel with a respective trimming transistor 620A-N that is configured to short across the respective MTJ device 610A-N. A respective select line ($VSSX_{A-N}$) can be coupled to control the trimming transistor 620A-N. The reference select line ($VSSX_{A-N}$) can be controlled by a row decoder.

Each group 605A-N can be fabricated such that current flow through each adjacent group 605A-N is substantially 180 degrees different in direction from each other. Thus, the reference resistance device 600 can have an equivalent number of reference MTJ devices 610A-N that are in a parallel resistive state and an antiparallel resistive state, so the total resistance of the reference resistance device 600 is substantially the average of the resistance of the reference MTJ devices 610A-N in the parallel state (Rp) and the resistance of the reference MTJ devices 610A-N in the antiparallel state (Rap) plus any resistance added by the trimming transistors 620A-N (Rtr).

As depicted in FIG. 6's example, each of the groups 605A-N of the reference MTJ devices 610A-N can include sixteen reference MTJ devices 610A-N, thus N=512 and the reference resistance device 600 has 512 reference MTJ devices 610A-N. Though this example includes sixteen reference MTJ devices 610A-N in each of the groups 605A-N, the reference resistance device 600 can include any practicable number of the reference MTJ devices 610A-N. Further, although sixteen of the groups 605A-N of the reference MTJ devices 610A-N are depicted in FIG. 6, the reference resistance device 600 can include any practicable number of the groups 605A-N of reference MTJ devices 610A-N. In examples, the groups 605A-N can include any positive number of the reference MTJ devices 610A-N greater than one. In further examples, there are more than one of the groups 605A-N.

Figure 7:
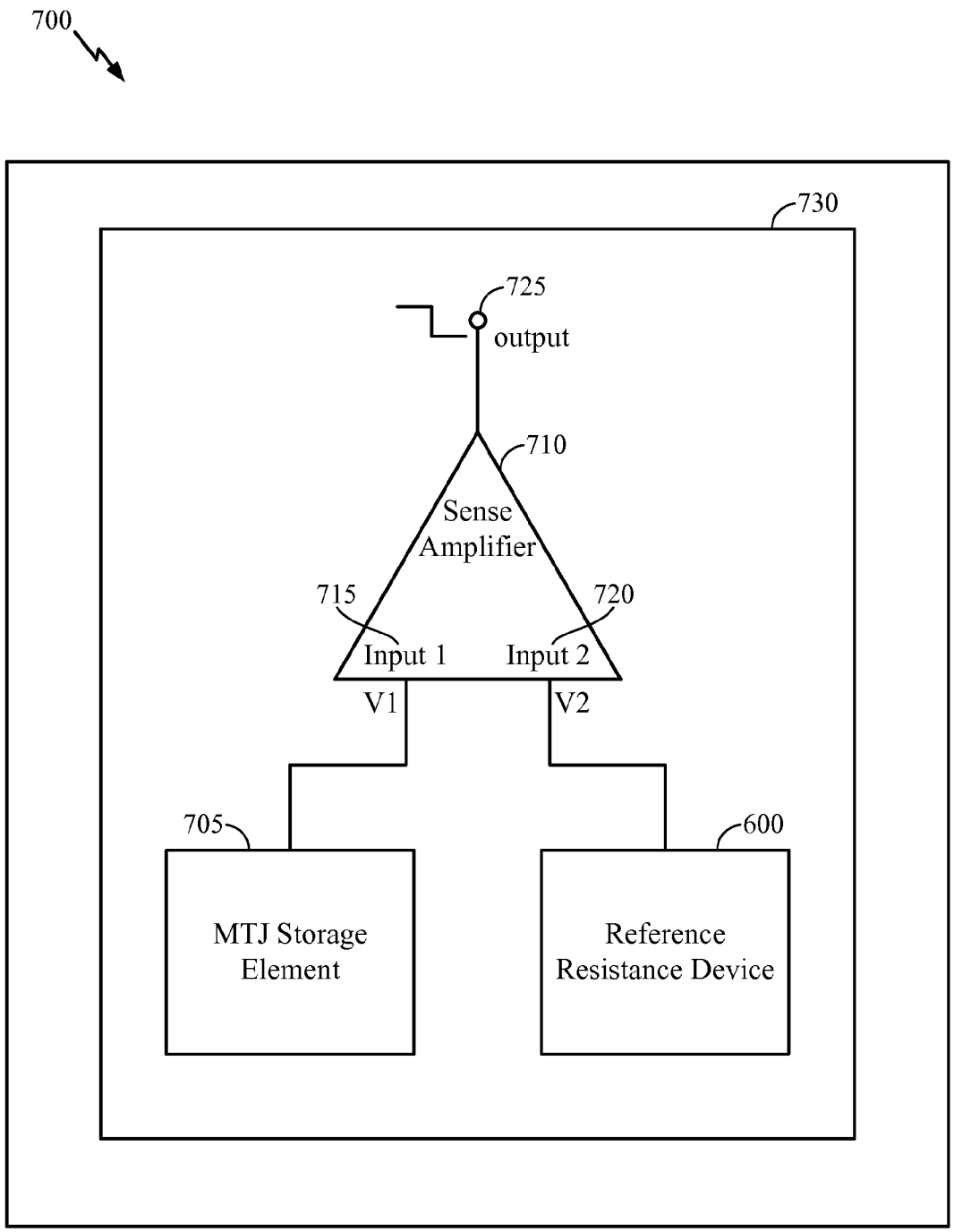
FIG. 7 depicts the exemplary reference resistance device as a constituent part of a MRAM.

As shown in FIG. 7, the reference resistance device 600 can be a constituent part of a magnetoresistive read only memory (MRAM) 700 that includes an MTJ storage element 705 and a sense amplifier 710 having a first input 715 coupled to the MTJ storage element 705. The reference resistance device 600 can be coupled to a second input 720 of the sense amplifier. The sense amplifier 710 compares a first voltage (V1) at the first input 715 to a second voltage (V2) at the second input 720, and outputs a high or low signal from the sense amplifier output 725, dependent upon the comparison results. At least a part of the MRAM 700 and/or the reference resistance device 600 can be integrated on a semiconductor die 730. In examples, the MRAM 700 can be a part of any of the three remote units 505, 515, and 525, and/or the two base stations 520A-B. In other examples, the MRAM 700 can be a part of a mobile device.

Figure 8:
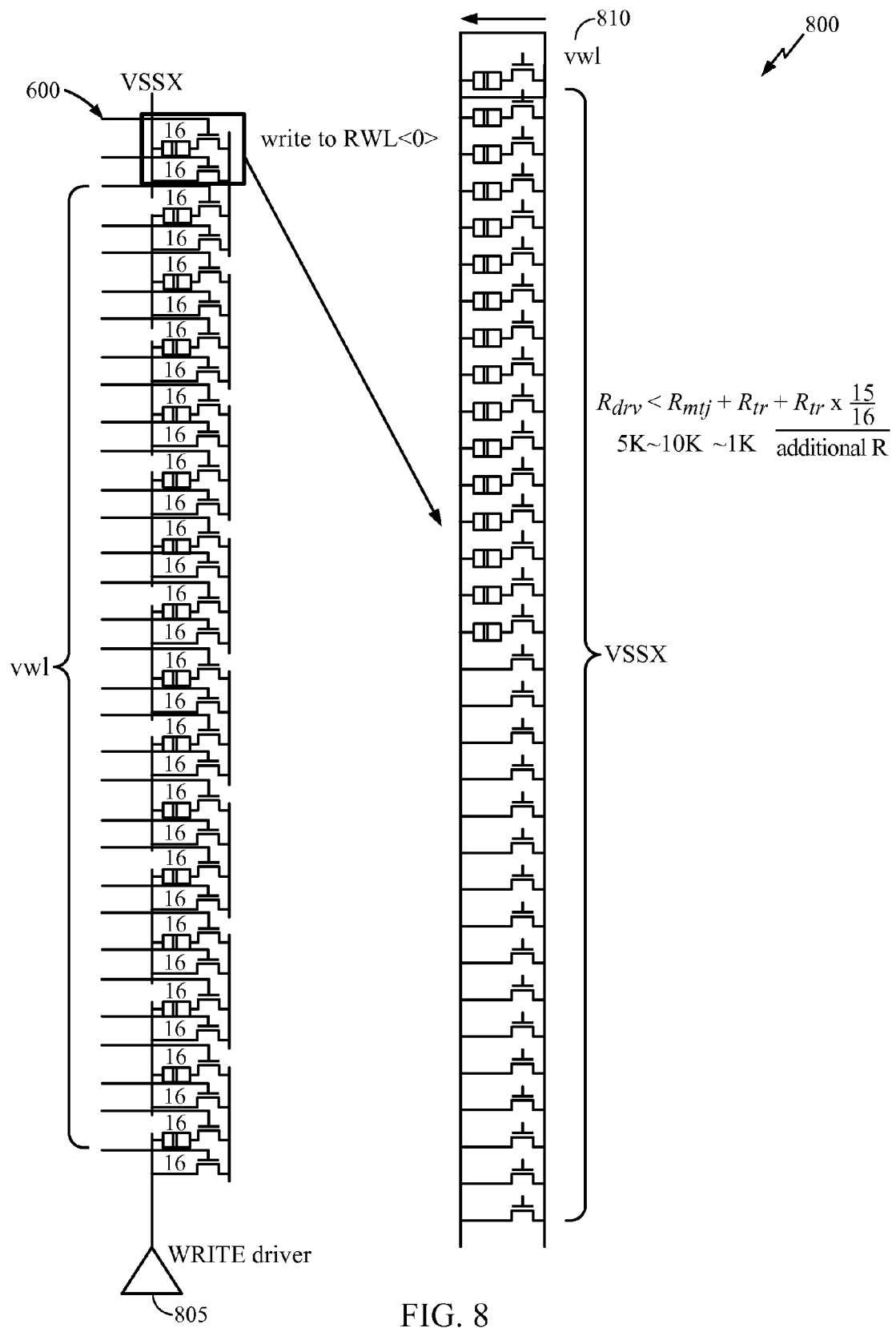
FIG. 8 depicts the exemplary reference resistance device during a write operation.

FIG. 8 depicts the reference resistance device 600 during an exemplary write operation 800. During the write operation 800, a write driver 805 passes a write current 810 through the reference MTJ devices 610A-N for which the respective switching transistors 615A-N are enabled, thus placing the respective reference MTJ devices 610A-N in a parallel or in an antiparallel state, and establishing a resistance of the reference resistance device 600.

Figure 9:
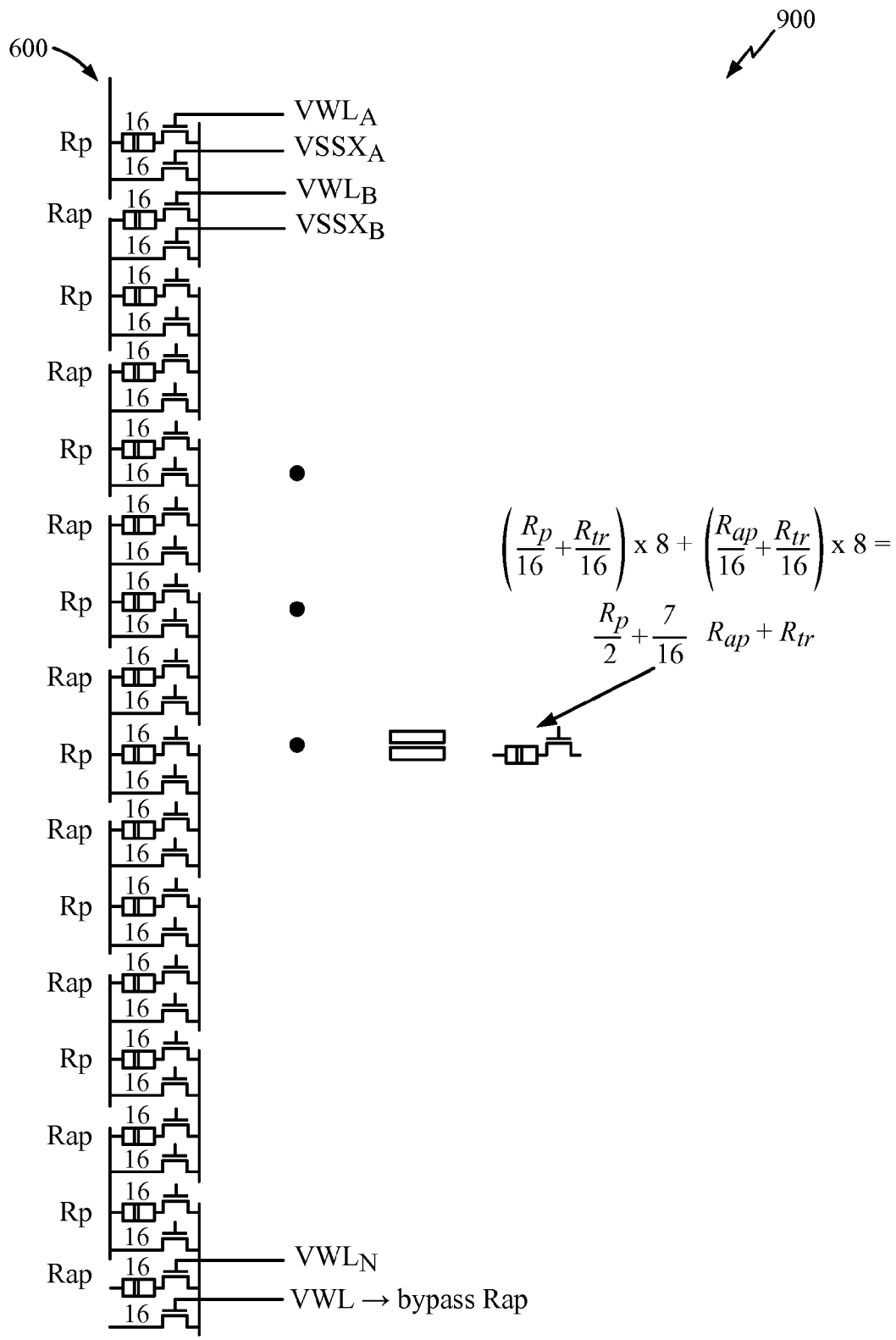
FIG. 9 depicts the exemplary reference resistance device during a reference resistance trimming operation.

FIG. 9 depicts the reference resistance device 600 during an exemplary reference resistance trimming operation 900. During the reference resistance trimming operation 900, a respective select line ($VSSX_{A-N}$) enables (e.g., turns on) a respective trimming transistor 620A-N for a respective MTJ device 610A-N. Enabling the respective trimming transistor 620A-N for the respective MTJ device 610A-N shorts across the respective MTJ device 610A-N to place the resistance added by the trimming transistors 620A-N(Rtr) in parallel with the resistance of the respective reference MTJ device 610A-N (either Rp or Rap). Thus, the trimming operation 900 varies the resistance of the reference resistance device 600.

Figure 10:
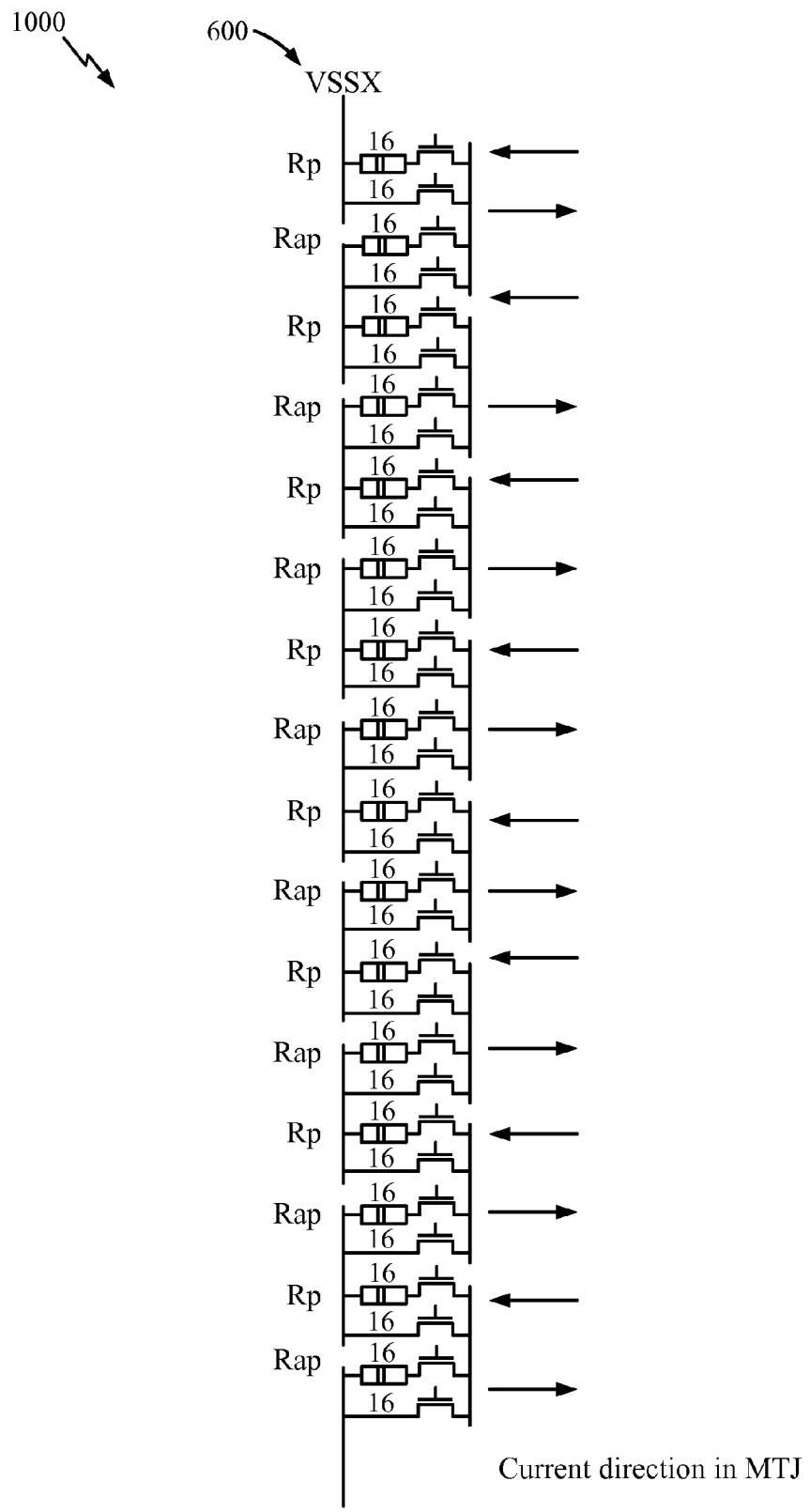
FIG. 10 depicts the exemplary reference resistance device during a reference read operation.

FIG. 10 depicts the reference resistance device 600 during an exemplary reference read operation 1000. During the reference read operation 1000, a current is passed through the reference resistance device 600 to generate a voltage across the reference resistance device that is input to the sense amplifier. As can be seen in FIG. 10, the current flow through the reference resistance device 600 travels in alternate directions during flow through groups 605A-N of the reference MTJ devices 610A-N. The current passing through the reference resistance device 600 during exemplary reference read operation 1000 in the same direction as the write operation results in mitigating read disturbances due to variation in the resistances (Rp and Rap) of the reference MTJ devices 610A-N.

Figure 11:
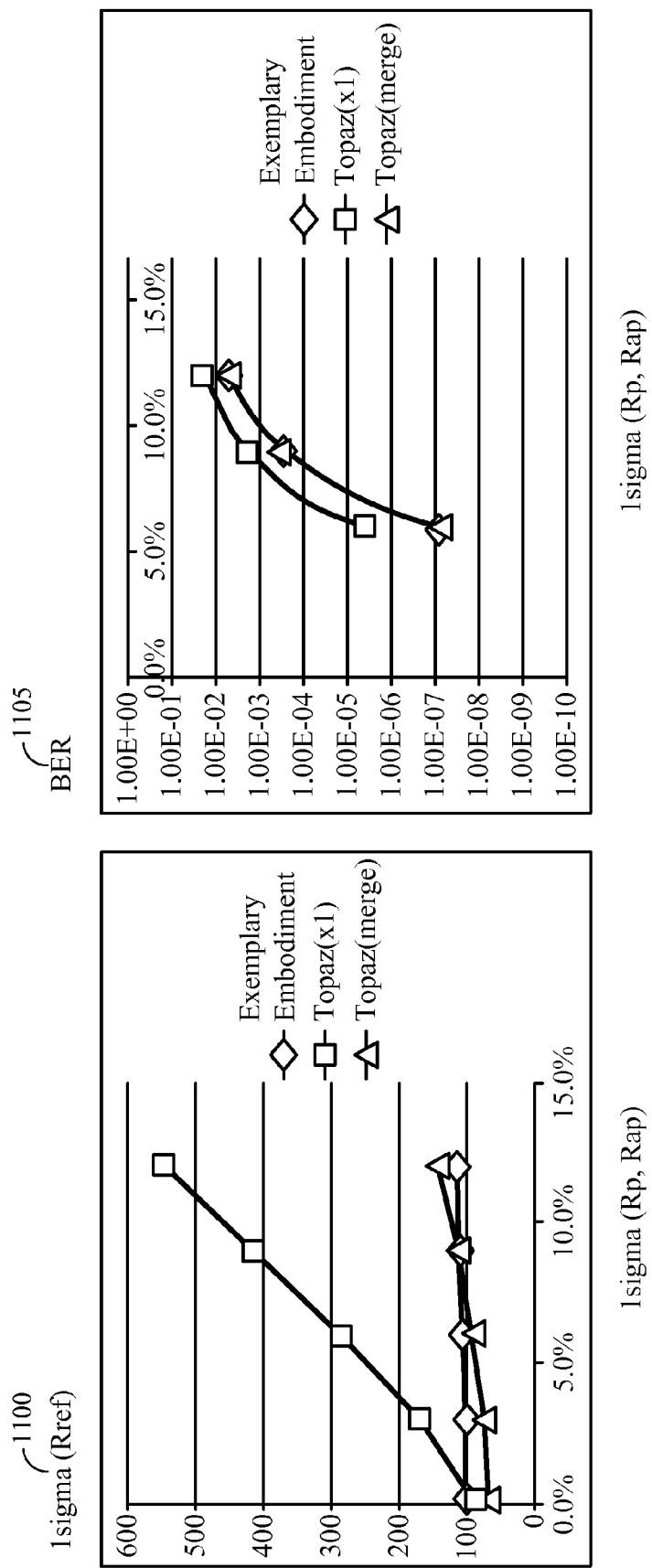
FIG. 11 depicts exemplary measurements of reference resistance distribution and bit error rate.

FIG. 11 depicts exemplary measurements of reference resistance distribution 1100 and bit error rate (BER) 1105 of the reference resistance device 600 versus conventional devices. The measurements of the reference resistance distribution 1100 show that the reference resistance device 600 has lower resistance variation than the conventional devices. The measurements of the BER 1105 show that the reference resistance device 600 has a similar or better BER than the BER of the conventional devices.

Figure 12:
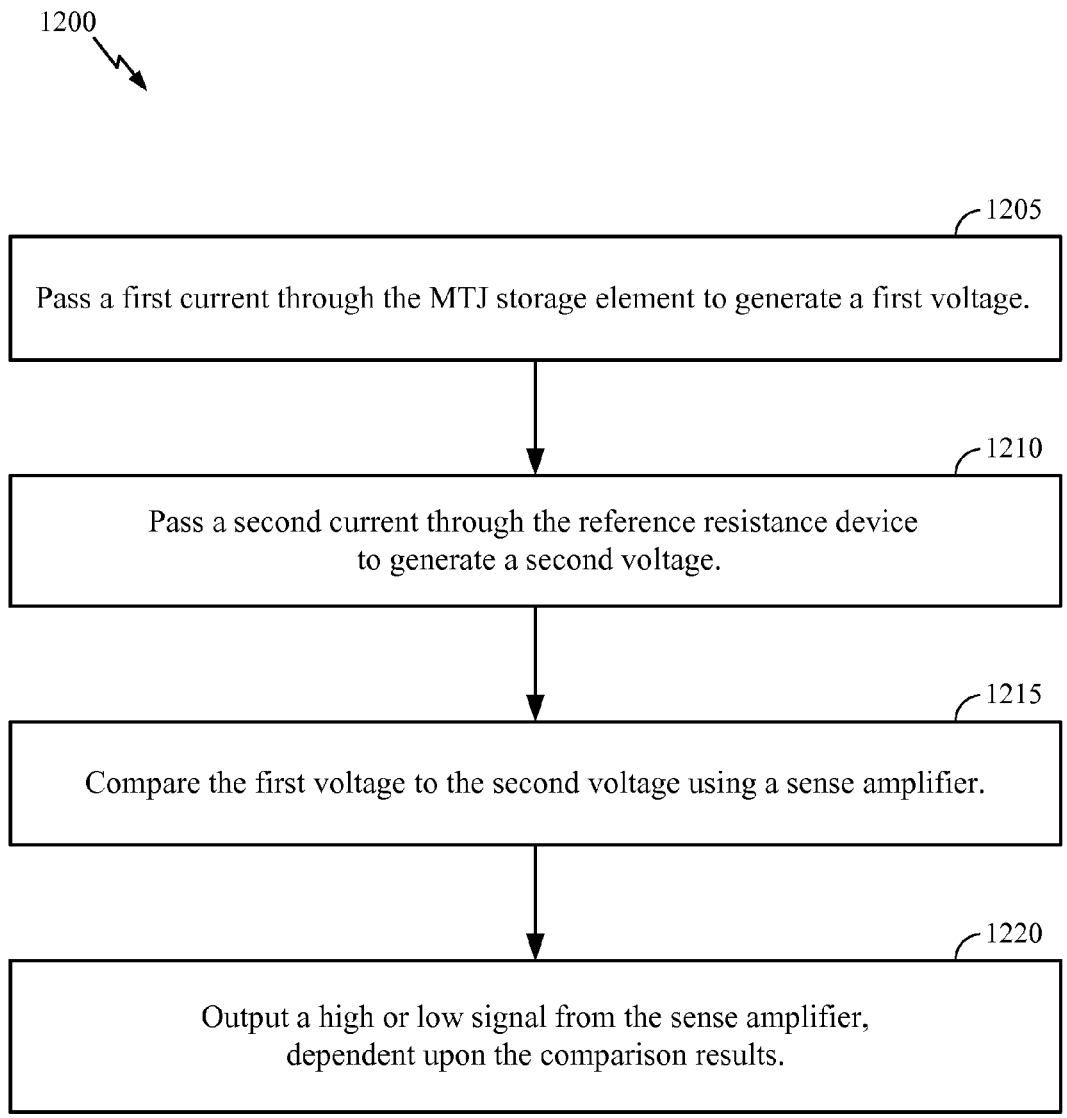
FIG. 12 depicts an exemplary method for reading an MTJ storage element.

FIG. 12 depicts an exemplary method for reading a magnetic tunnel junction (MTJ) storage element 1200. The method for reading the MTJ storage element 1200 can be performed using the apparatus described hereby, such as the reference resistance device 600.

In step 1205, a first current is passed through the MTJ storage element to generate a first voltage.

In step 1210, a second current is passed through the reference resistance device 600 to generate a second voltage.

In step 1215, the first voltage is compared to the second voltage using a sense amplifier.

In step 1220, the sense amplifier outputs a high or low signal, dependent upon the comparison results. For example, if the first voltage is greater than the second voltage, the sense amplifier outputs a high value (e.g., a logic "1") indicating that the MTJ storage element is storing a high value (e.g., a logic "1"). If the first voltage is less than the second voltage, the sense amplifier outputs a low value (e.g., a logic "0") indicating that the MTJ storage element is storing a low value (e.g., a logic "0").

Figure 13:
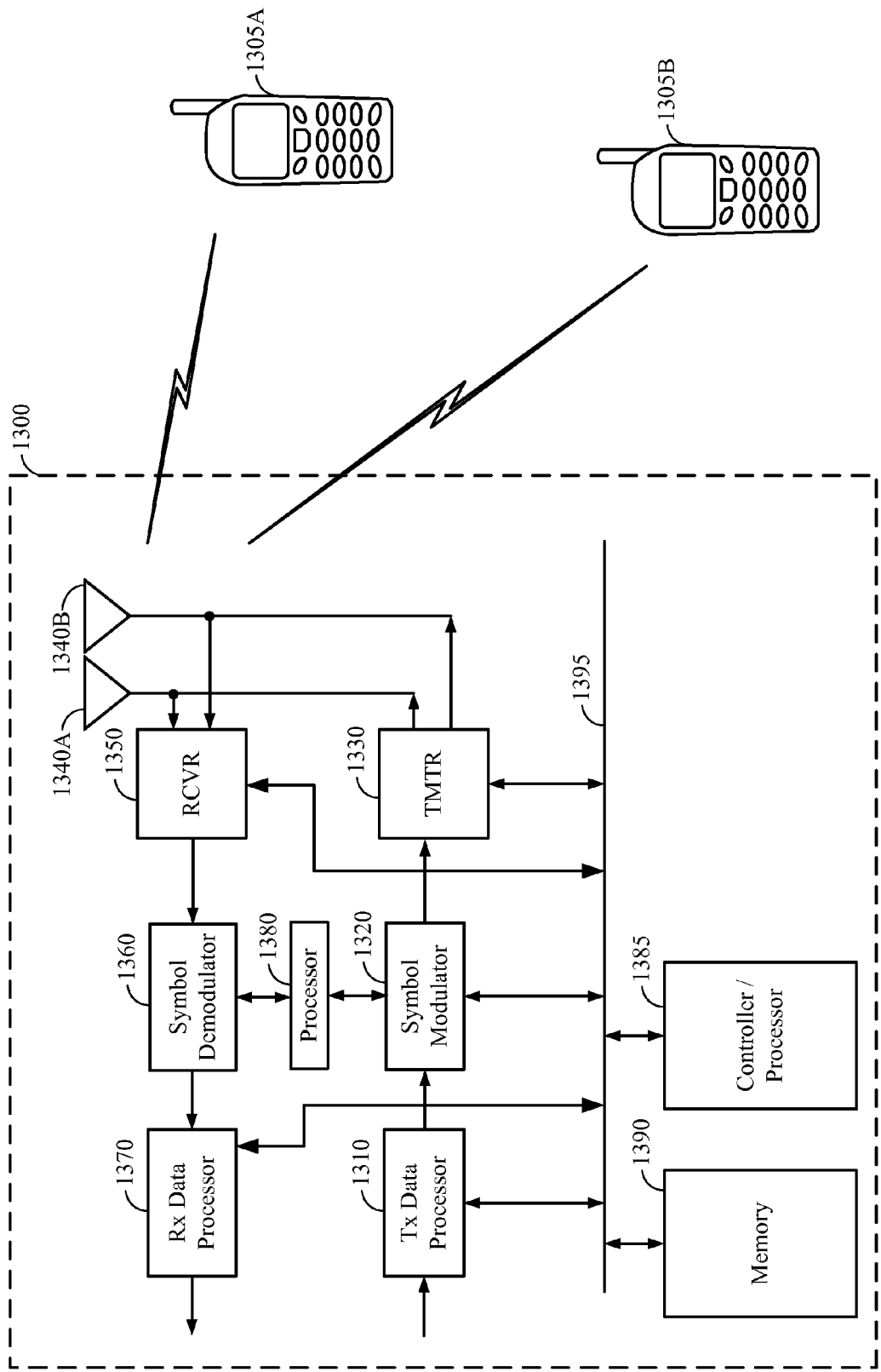
FIG. 13 depicts an exemplary access point.

FIG. 13 depicts an exemplary access point (AP) 1300. The access point 1300 can be, for example, any of the base stations 520A-B. As shown, the access point 1300 includes a TX data processor 1310, symbol modulator 1320, transmitter unit (TMTR) 1330, one or more antennas (e.g., antennas 1340A-B), receiver unit (RCVR) 1350, symbol demodulator 1360, RX data processor 1370, and configuration information processor 1380, performing various operations to communicate with one or more mobile devices (e.g., user devices 1305A-B). The access point 1300 can also include one or more controllers and/or processors (illustrated in the singular as the controller/processor 1385) and a memory 1390 configured to store related data or instructions. Together, via a bus 1395, these units can perform processing in accordance with an appropriate radio technology or technologies used for communication, as well as other functions for the access point 1300. The MRAM 700 and/or the exemplary reference resistance device 600 can be a part of a circuit within, and/or coupled to, a portion of the access point 1300, such as the TX data processor 1310, the symbol modulator 1320, the transmitter unit (TMTR) 1330, the receiver unit (RCVR) 1350, the symbol demodulator 1360, the RX data processor 1370, and/or the configuration information processor 1380 and/or the controller/processor 1385. In an example, any of the base stations 520A-B and/or the access point 1300 is configured to perform at least a part of a method described hereby.

The access point 1300 can provide a wireless local area network (WLAN) air interface (e.g., in accordance with an IEEE 802.11x protocol), and/or a cellular air interface (e.g., in accordance with an LTE protocol). The access point 1300 can communicate with a user device (e.g., user devices 1305A-B), and a user device (e.g., user devices 1305A-B) can communicate with the access point 1300. In general, the access point 1300 can provide an air interface (e.g., in accordance with an IEEE 802.11x protocol) over an unlicensed portion of the wireless spectrum such as an industrial, scientific, and medical (ISM) radio band, and/or can provide an air interface (e.g., in accordance with an LTE protocol) over a licensed portion of the wireless band reserved for cellular communications. The access point 1300 can also be configured to provide cellular (e.g., LTE) connectivity over an unlicensed portion of the wireless spectrum. This type of unlicensed cellular operation can include the use of an anchor licensed carrier operating in a licensed portion of the wireless spectrum (e.g., LTE Supplemental DownLink (SDL)) and an unlicensed portion of the wireless spectrum (e.g., LTE-Unlicensed), or can be a standalone configuration operating without using an anchor licensed carrier (e.g., LTE Standalone).

Figure 14:
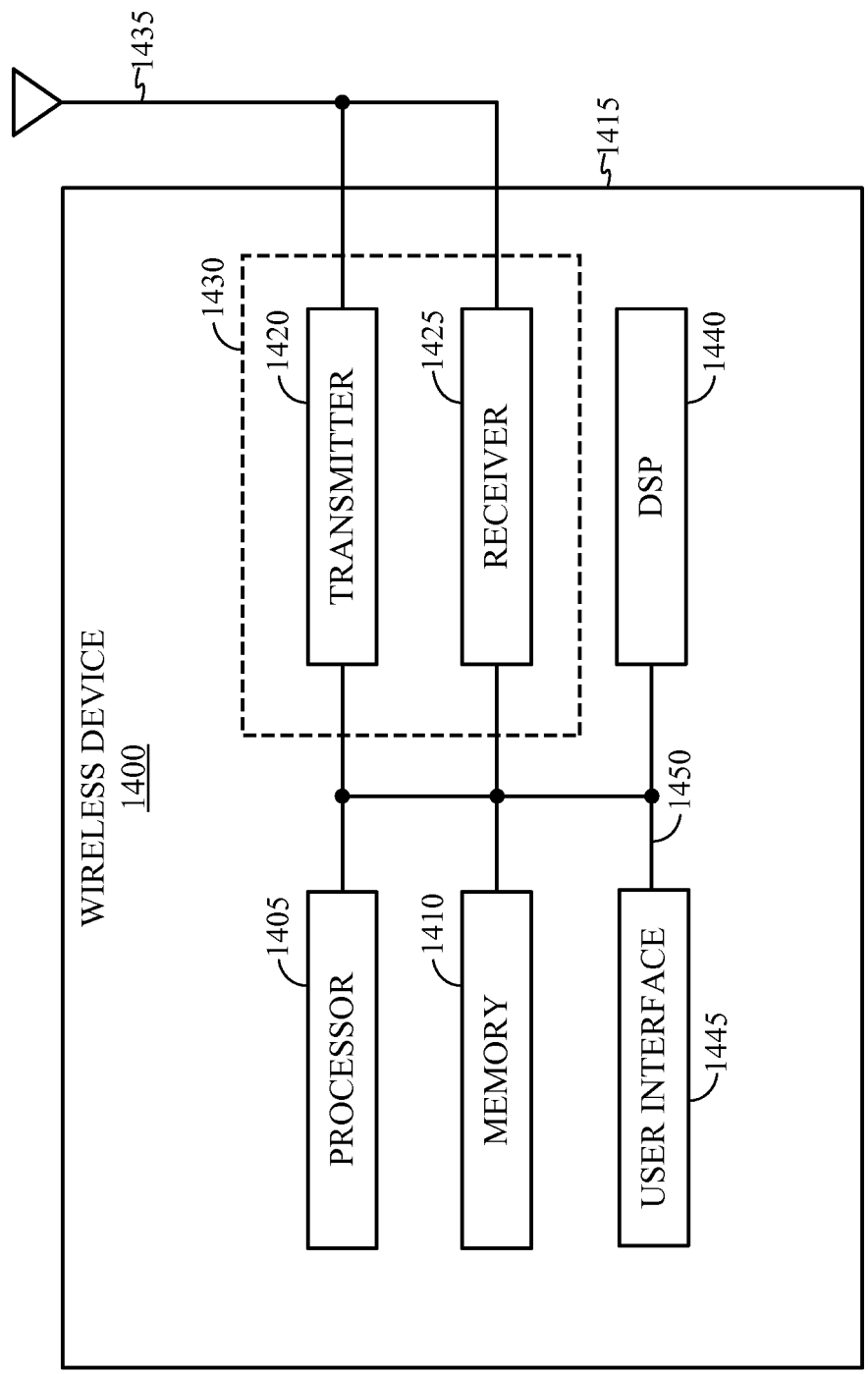
FIG. 14 depicts a functional block diagram of an exemplary wireless device.

FIG. 14 illustrates various components that can be utilized in a wireless device 1400 (e.g., a mobile device) that can be employed within the wireless communication system 500. The wireless device 1400 is an example of a device that can be configured to include the apparatus described herein. The wireless device 1400 can be, for example, any of three remote units 505, 515, and 525. The wireless device 1400 can be a mobile device, such as a user device (e.g., user devices 1305A-B).

The wireless device 1400 can include a processor 1405 which controls operation of the wireless device 1400. The processor 1405 can also be referred to as a central processing unit (CPU). A memory 1410, which can include both read-only memory (ROM) and random access memory (RAM) (e.g., the MRAM 700), provides instructions and data to the processor 1405. A portion of the memory 1410 can also include non-volatile random access memory (NVRAM). The processor 1405 performs logical and arithmetic operations based on program instructions stored within the memory 1410. The instructions in the memory 1410 can be executable to implement the methods described herein.

The processor 1405 can comprise or be a component of a processing system implemented with one or more processors. The one or more processors can be implemented with a microprocessor, a microcontroller, a digital signal processor (DSP), a field programmable gate array (FPGA), a programmable logic device (PLD), a controller, a state machine, gated logic, a discrete hardware component, a dedicated hardware finite state machine, and/or any other suitable entity that can calculate and/or manipulate information.

The processing system can also include a non-transitory machine-readable media that stores software. Software can mean any type of instructions, whether referred to as software, firmware, middleware, microcode, hardware description language, and/or otherwise. Instructions can include code (e.g., in source code format, binary code format, executable code format, or any other suitable format of code). The instructions, when executed by the one or more processors, can transform the processor (e.g., the processor 1405) into a special-purpose processor that cause the processor to perform a function described herein.

The wireless device 1400 can also include a housing 1415, a transmitter 1420, and a receiver 1425 to allow transmission and reception of data between the wireless device 1400 and a remote location. The transmitter 1420 and receiver 1425 can be combined into a transceiver 1430. An antenna 1435 can be attached to the housing 1415 and electrically coupled to the transceiver 1430. The wireless device 1400 can also include (not shown) multiple transmitters, multiple receivers, multiple transceivers, and/or multiple antennas.

The wireless device 1400 can further comprise a digital signal processor (DSP) 1440 that is configured to process data. The wireless device 1400 can also further comprise a user interface 1445. The user interface 1445 can comprise a keypad, a microphone, a speaker, and/or a display. The user interface 1445 can include any element and/or component that conveys information to a user of the wireless device 1400 and/or receives input from the user.

The various components of the wireless device 1400 can be coupled together by a bus system 1450. The bus system 1450 can include a data bus, for example, as well as a power bus, a control signal bus, and/or a status signal bus in addition to the data bus. Those of skill in the art will appreciate the components of the wireless device 1400 can be coupled together to accept or provide inputs to each other using some other mechanism.

The MRAM 700 and/or the exemplary reference resistance device 600 can be a part of a circuit within, and/or coupled to, a portion of the wireless device 1400, such as the processor 1405, the memory 1410, the transmitter 1420, the receiver 1425, and/or the DSP 1440. In an example, any of the base stations 520A-B and/or the wireless device 1400 is configured to perform at least a part of a method described hereby.

Although a number of separate components are illustrated in FIG. 14, those of skill in the art will recognize that one or more of the components can be combined or commonly implemented. For example, the processor 1405 can be used to implement not only the functionality described above with respect to the processor 1405, but also to implement the functionality described above with respect to the DSP 1440. Further, each of the components illustrated in FIG. 14 can be implemented using a plurality of separate elements.

Further, those of skill in the art will appreciate that the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1×RTT, 1×EV-DO RelO, RevA, RevB) technology and other technologies. The techniques can be used in emerging and future networks and interfaces, including Long Term Evolution (LTE).

At least a portion of the methods, sequences, and/or algorithms described in connection with the embodiments disclosed herein can be embodied directly in hardware, in software executed by a processor, or in a combination of the two. In an example, a processor includes multiple discrete hardware components. A software module can reside in RAM memory, flash memory, ROM memory, EPROM memory, EEPROM memory, registers, hard disk, a removable disk, a CD-ROM, and/or any other form of storage medium known in the art. An exemplary storage medium (e.g., a memory) can be coupled to the processor such that the processor can read information from, and write information to, the storage medium. In an alternative, the storage medium can be integral with the processor.

Further, many embodiments are described in terms of sequences of actions to be performed by, for example, elements of a computing device. The actions described herein can be performed by a specific circuit (e.g., an application specific integrated circuit (ASIC)), by program instructions being executed by one or more processors, or by a combination of both. Additionally, a sequence of actions described herein can be considered to be embodied entirely within any form of computer readable storage medium having stored therein a corresponding set of computer instructions that upon execution would cause an associated processor (such as a special-purpose processor) to perform at least a portion of a function described herein. Thus, the various aspects of the invention can be embodied in a number of different forms, all of which have been contemplated to be within the scope of the claimed subject matter. In addition, for each of the embodiments described herein, a corresponding circuit of any such embodiments can be described herein as, for example, "logic configured to" perform a described action.

An embodiment of the invention can include a computer readable media embodying a method described herein. Accordingly, the invention is not limited to illustrated examples and any means for performing the functions described herein are included in embodiments of the invention.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which are stored on a non-transitory (i.e., a non-transient) computer-readable media. The file can be provided to a fabrication handler who fabricates with a lithographic device, based on the file, an integrated device. In an example, the integrated device is on a semiconductor wafer. The semiconductor wafer can be cut into a semiconductor die and packaged into a semiconductor chip. The semiconductor chip can be employed in a device described herein (e.g., a mobile device).

Embodiments can include a non-transitory (i.e., a non-transient) machine-readable media and/or a non-transitory (i.e., a non-transient) computer-readable media embodying instructions which, when executed by a processor (such as a special-purpose processor), transform a processor and any other cooperating devices into a machine (e.g., a special-purpose processor) configured to perform at least a part of a function described hereby and/or transform a processor and any other cooperating devices into at least a part of the apparatus described hereby.

Nothing stated or illustrated depicted in this application is intended to dedicate any component, step, feature, object, benefit, advantage, or equivalent to the public, regardless of whether the component, step, feature, object, benefit, advantage, or the equivalent is recited in the claims.

While this disclosure describes exemplary embodiments of the invention, it should be noted that various changes and modifications could be made herein without departing from the scope of the invention as defined by the appended claims.

What is claimed is:

1. A method for reading a magnetic tunnel junction (MTJ) storage element, comprising:
    passing a first current through the MTJ storage element to generate a first voltage;
    passing a second current through a reference resistance device to generate a second voltage,
    wherein the reference resistance device includes a plurality of groups of at least two reference MTJ devices, each reference MTJ device in a respective group is coupled in parallel with each other reference MTJ device in the respective group, and each group of reference MTJ devices is coupled in series with the other groups of reference MTJ devices;
    shorting across the entirety of at least one of the reference MTJ devices;
    comparing the first voltage to the second voltage using a sense amplifier to create comparison results; and
    outputting a high or low signal from the sense amplifier, dependent upon the comparison results.

2. The method of claim 1, wherein each group of reference MTJ devices includes sixteen reference MTJ devices.

3. The method of claim 1, further comprising at least one of selectively enabling and selectively disabling at least one of the reference MTJ devices.

4. The method of claim 1, further comprising using a row decoder to perform the at least one of selectively enabling and selectively disabling at least one of the reference MTJ devices.

5. An apparatus configured to read a magnetic tunnel junction (MTJ) storage element, comprising:
    means for passing a first current through the MTJ storage element to generate a first voltage;
    means for passing a second current through a reference resistance device to generate a second voltage,
    wherein the reference resistance device includes a plurality of groups of at least two reference MTJ devices, each reference MTJ device in a respective group is coupled in parallel with each other reference MTJ device in the respective group, and each group of reference MTJ devices is coupled in series with the other groups of reference MTJ devices;
    means for shorting across the entirety of a respective one of the reference MTJ devices; and
    a sense amplifier configured to compare the first voltage to the second voltage to create comparison results, and configured to output a high or low signal, dependent upon the comparison results.

6. The apparatus of claim 5, wherein each group of reference MTJ devices includes sixteen reference MTJ devices.

7. The apparatus of claim 5, further comprising at least one of means for selectively enabling and means for selectively disabling at least one of the reference MTJ devices.

8. The apparatus of claim 5, further comprising a row decoder configured to at least one of selectively enable and selectively disable at least one of the reference MTJ devices.

9. The apparatus of claim 5, wherein at least a part of the reference resistance device is integrated on a semiconductor die.

10. The apparatus of claim 5, further comprising at least one of a mobile device, a base station, a terminal, a set top box, music player, video player, entertainment unit, navigation device, communications device, personal digital assistant (PDA), fixed location data unit, and a computer, with which the reference resistance device is integrated.

11. An apparatus, comprising:
    a magnetoresistive read only memory including:
        a magnetic tunnel junction (MTJ) storage element;
        a sense amplifier having a first input coupled to the MTJ storage element;
        a reference resistance device coupled to a second input of the sense amplifier,
        wherein the reference resistance device includes a plurality of groups of at least two reference MTJ devices, each reference MTJ device in a respective group is coupled in parallel with each other reference MTJ device in the respective group, and each group is coupled in series with the other groups; and
        a transistor configured to short across the entirety of a respective one of the reference MTJ devices.

12. The apparatus of claim 11, wherein each group of reference MTJ devices includes sixteen reference MTJ devices.

13. The apparatus of claim 11, wherein at least one of the reference MTJ devices is coupled in series with a transistor configured to enable and disable the respective reference MTJ device.

14. The apparatus of claim 11, further comprising a row decoder configured to enable and disable at least one of the reference MTJ devices.

15. The apparatus of claim 11, wherein at least a part of the magnetoresistive read only memory is integrated on a semiconductor die.

16. The apparatus of claim 11, further comprising at least one of a mobile device, a base station, a terminal, a set top box, a music player, a video player, an entertainment unit, a navigation device, a communications device, a personal digital assistant (PDA), a fixed location data unit, and a computer, of which the magnetoresistive read only memory is a constituent part.

17. A non-transitory computer-readable medium, comprising lithographic device-executable instructions stored thereon configured to cause a lithographic device to fabricate at least a part of an integrated circuit, comprising:
    a magnetoresistive read only memory including:
        a magnetic tunnel junction (MTJ) storage element;
        a sense amplifier having a first input coupled to the MTJ storage element;
        a reference resistance device coupled to a second input of the sense amplifier,
        wherein the reference resistance device includes a plurality of groups of at least two reference MTJ devices, each reference MTJ device in a respective group is coupled in parallel with each other reference MTJ device in the respective group, and each group is coupled in series with the other groups and a transistor configured to short across the entirety of a respective one of the reference MTJ devices.

18. The non-transitory computer-readable medium of claim 17, further comprising executable instructions stored thereon configured to cause the lithographic device to fabricate sixteen reference MTJ devices in each group of reference MTJ devices.

19. The non-transitory computer-readable medium of claim 17, further comprising executable instructions stored thereon configured to cause the lithographic device to fabricate at least one of the reference MTJ devices is coupled in series with a transistor configured to enable and disable the respective reference MTJ device.

20. The non-transitory computer-readable medium of claim 17, further comprising executable instructions stored thereon configured to cause the lithographic device to fabricate a row decoder configured to enable and disable at least one of the reference MTJ devices.

* * * * *